US011447380B1

(12) United States Patent
Thompson

(10) Patent No.: US 11,447,380 B1
(45) Date of Patent: Sep. 20, 2022

(54) VOLTAGE AND CURRENT ALERT SYSTEM FOR AERIAL DEVICE

(71) Applicant: Altec Industries, Inc., Birmingham, AL (US)

(72) Inventor: Jesse Thompson, Shepherdsville, KY (US)

(73) Assignee: Altec Industries, Inc., Birmingham, AL (US)

( * ) Notice: Subject to any disclaimer, the term of this patent is extended or adjusted under 35 U.S.C. 154(b) by 0 days.

(21) Appl. No.: 17/557,281

(22) Filed: Dec. 21, 2021

(51) Int. Cl.
*G01R 1/067* (2006.01)
*G01R 1/073* (2006.01)
*G01R 19/155* (2006.01)
*G01R 19/25* (2006.01)
*G05D 1/02* (2020.01)
*B66F 17/00* (2006.01)
*B66F 11/04* (2006.01)

(52) U.S. Cl.
CPC .......... *B66F 17/006* (2013.01); *B66F 11/046* (2013.01); *G01R 1/06777* (2013.01); *G01R 19/155* (2013.01)

(58) Field of Classification Search
CPC .... G01R 1/067; G01R 1/06777; G01R 1/073; G01R 19/155; G01R 19/25; G05D 1/02
See application file for complete search history.

(56) References Cited

U.S. PATENT DOCUMENTS

| | | | |
|---|---|---|---|
| 6,170,607 B1 * | 1/2001 | Freeman | B66C 15/065 |
| | | | 182/2.1 |
| 8,022,708 B2 * | 9/2011 | Xie | G01R 31/086 |
| | | | 324/501 |
| 9,527,713 B2 | 12/2016 | Freeman et al. | |
| 10,302,686 B1 | 5/2019 | Cosgrove | |
| 10,338,107 B1 * | 7/2019 | Beck | B66F 17/006 |
| 2003/0011354 A1 | 1/2003 | Daniel | |
| 2014/0070792 A1 * | 3/2014 | Shan | G01R 15/241 |
| | | | 324/96 |
| 2016/0363621 A1 | 12/2016 | Kalokitis | |

* cited by examiner

*Primary Examiner* — Neel D Shah
(74) *Attorney, Agent, or Firm* — Erise IP, P.A.

(57) ABSTRACT

A voltage and current alert system and method for an aerial vehicle including an extendable boom member is disclosed. The system and method include voltage and current sensors disposed throughout the aerial vehicle. The system and method further include components for conversion of the alert signal from a digital signal to a fiber optic signal, therein decreasing the power requirements of the system as well as allowing the signal to bypass a dielectric gap. The system further may shutdown operation of the aerial vehicle upon a detection event.

20 Claims, 11 Drawing Sheets

VOLTAGE AND CURRENT ALERT SYSTEM FOR AERIAL DEVICE

BACKGROUND

1. Field

Embodiments of the invention relate to alert systems for aerial devices. More specifically, embodiments of the invention relate to voltage and current alert systems.

2. Related Art

Aerial devices are commonly used to perform tasks at heights not typically or reasonably reached by other means. For example, aerial devices can be used to hoist workers up to perform tasks such as trimming trees, building construction, roofing, sign maintenance, electrical line maintenance and erection, etc. At times, these aerial devices may need to work within the vicinity of an energized part (i.e., a device or portion of a device that provides high amounts of electricity). Such an energized part may include, for example, a transmission line or a distribution line. Transmission lines and distribution lines both carry and propagate high levels of electricity (e.g., 120 volts up to 500 kV).

Aerial devices working near these energized parts are themselves in danger of becoming energized (i.e., conducting electricity therethrough). For example, if the aerial device, or a portion of the aerial device, is comprised of conductive materials and comes into close range of the energized part, the electricity may travel through the aerial device. Such an event may cause significant danger to any worker located on the aerial device or near the base of the aerial device. Mitigation efforts have been taken to prevent electricity from traveling through the aerial device. For example, a dielectric gap can be formed across the boom of some aerial devices by constructing the boom and interior of nonconducting materials. However, insulation of this region requires a lack of electrical signaling via wire between the base of the aerial device and the tip of the boom.

Current methods to prevent such an event from occurring are mostly primitive. This includes a worker, or workers, observing the operation of the aerial device to warn an operator of a close contact. Other such disclosed methods may include a sensor which communicates wirelessly. For example, U.S. Pat. No. 10,302,686 to Cosgrove discloses a sensor system to detect high voltage that utilizes wireless communication between a sensor and a boom. Powering such wireless systems requires a greater power supply which may require the power supply (e.g., a battery) to be changed regularly. U.S. Patent Application Publication No. 2003/0011354 to Daniel similarly discloses a voltage detection device on the boom of a truck that lacks a method to decrease the power needs of the system. Therefore, there is a clear need in the field for a voltage or current detection system that comprises a low need for power.

The present invention overcomes these downfalls by providing a device, system, and method for converting a digital signal relaying a voltage detection event into a fiber optic signal. Such a fiber optic signal both bypasses the dielectric gap created by an insulated boom as well as requires much lower power supply for relaying said signal compared to a wireless communication system. Conversion systems for conversion of a signal into a fiber optic signal are known for other, unrelated tasks, such as U.S. Patent Application No. 2016/08363621 to Kalokitis, and U.S. Pat. No. 8,022,708 to Xie et al.

SUMMARY

Embodiments of the invention solve the above-mentioned problems by providing a device, system, and method for detecting voltage or current from an energized part within a specific proximity to a portion of an aerial device.

In some aspects, the techniques described herein relate to an aerial device, including: a boom configured to be attached to a base at a first end; a platform attached to the boom at a second end; one or more voltage and current sensors disposed on one or more of the boom and the platform; a controller operatively connected to the boom and the one or more voltage and current sensors; and an alarm subsystem operatively connected to the controller, wherein the alarm subsystem is configured to receive a fiber optic signal from the controller upon detection of a voltage or a current that is above a predetermined threshold by the one or more voltage and current sensors, wherein upon receiving the fiber optic signal, the alarm subsystem alerts one or more users of the detection of the voltage or current.

In some aspects, the techniques described herein relate to an aerial device, wherein the boom includes a lower boom and an upper boom with an elbow disposed therebetween, the elbow having at least one voltage and current sensor disposed thereon.

In some aspects, the techniques described herein relate to an aerial device, further including an acknowledgement indicator configured to relay an acknowledgement signal of a voltage detection or a current detection to the controller.

In some aspects, the techniques described herein relate to an aerial device, further including an elevator disposed between the base and the first end of the boom, the elevator configured to raise the boom in a substantially vertical direction, and the elevator having at least one voltage and current sensor disposed thereon.

In some aspects, the techniques described herein relate to an aerial device, wherein the controller is configured to prevent movement of the boom upon detection of the voltage or the current that is above the predetermined threshold by the one or more voltage and current sensors.

In some aspects, the techniques described herein relate to an aerial device, further including fiber optic conversion hardware for converting a digital signal to the fiber optic signal.

In some aspects, the techniques described herein relate to a voltage and current alert system configured to detect proximity of an energized part near a boom of an aerial device, the system including: a controller operatively connected to the boom and one or more voltage and current sensors disposed on the aerial device, the one or more voltage and current sensors configured to send a digital signal upon a detection event to the controller; a fiber optic low power (FOCL) conversion hardware operatively connected to the controller, the FOCL conversion hardware configured to convert the digital signal to a fiber optic signal; and an alert subsystem operatively connected to the FOCL conversion hardware, the alert subsystem configured to receive the fiber optic signal and alert one or more users of the aerial device of the detection event.

In some aspects, the techniques described herein relate to a voltage and current alert system, wherein the boom is connected to a base of the aerial device at a first end and is connected to a platform at a second end, the platform configured to support one or more users of the aerial device, wherein the alert subsystem includes an alert device disposed on the platform, the alert device is configured to alert the one or more users of the platform of the detection event.

In some aspects, the techniques described herein relate to a voltage and current alert system, wherein the boom is connected to a base of the aerial device at a first end and is connected to a platform at a second end, the platform configured to support one or more users of the aerial device, wherein the alert subsystem includes an alert device disposed on the base, the alert device is configured to alert one or more users nearby the base of the aerial device.

In some aspects, the techniques described herein relate to a voltage and current alert system, wherein the controller determines if a measured distance of the energized part from the aerial device is above a threshold allowable distance.

In some aspects, the techniques described herein relate to a voltage and current alert system, wherein the fiber optic signal is configured to bypass a dielectric gap caused by insulating the boom.

In some aspects, the techniques described herein relate to a voltage and current alert system, wherein the controller is configured to prevent movement of the boom upon the detection event.

In some aspects, the techniques described herein relate to a voltage and current alert system, wherein the controller requires an acknowledgement by one or more users of the detection event before allowing movement of the boom.

In some aspects, the techniques described herein relate to a voltage and current alert system, the system including: a processor; and one or more non-transitory computer readable storage media having a computer program stored thereon for alerting one or more users of an aerial device, wherein the computer program instructs the processor to perform actions including: receiving a startup signal from one or more components of the aerial device; monitoring for a voltage or a current from an energized part via one or more sensors disposed on the aerial device; detecting the voltage or the current from the energized part via the one or more sensors; determining whether a measured voltage or a measured current is above a threshold voltage or a threshold current, respectively; converting a digital signal from the one or more sensors to a fiber optic low power (FOCL) signal via a FOCL conversion hardware, wherein the FOCL signal is configured to pass through a dielectric gap; and alerting the one or more users via an alert subsystem.

In some aspects, the techniques described herein relate to a voltage and current alert system, the actions further including: preventing movement of the one or more components of the aerial device when the detected voltage or the detected current is above the threshold voltage or the threshold current, respectively.

In some aspects, the techniques described herein relate to a voltage and current alert system, the actions further including: determining if a measured distance of the energized part from the aerial device is above a threshold allowable distance.

In some aspects, the techniques described herein relate to a voltage and current alert system, the actions further including: monitoring for acknowledgement of a detection event from the one or more users; receiving the acknowledgement of the detection event; and allowing movement of the one or more components of the aerial device following receiving the acknowledgement.

In some aspects, the techniques described herein relate to a voltage and current alert system, the actions further including: recording detection event data, wherein the detection event data includes aspects of one or more of a first measured voltage, a first measured current, a first measured distance, or a first measured direction of the energized part.

In some aspects, the techniques described herein relate to a voltage and current detection system, the actions further including: adjusting, based on the detection event data, one or more of a threshold voltage, a threshold current, or a threshold distance to generate an updated threshold voltage, an updated threshold current, or an updated threshold allowable distance.

In some aspects, the techniques described herein relate to a voltage and current detection system, the actions further including: alerting the one or more users via the alert subsystem if a controller, via the one or more sensors, determines that a second measured voltage is greater than the updated threshold voltage, that a second measured current is greater than the updated threshold current, or that a second measured distance is less than the updated threshold allowable distance, respectively.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 3:
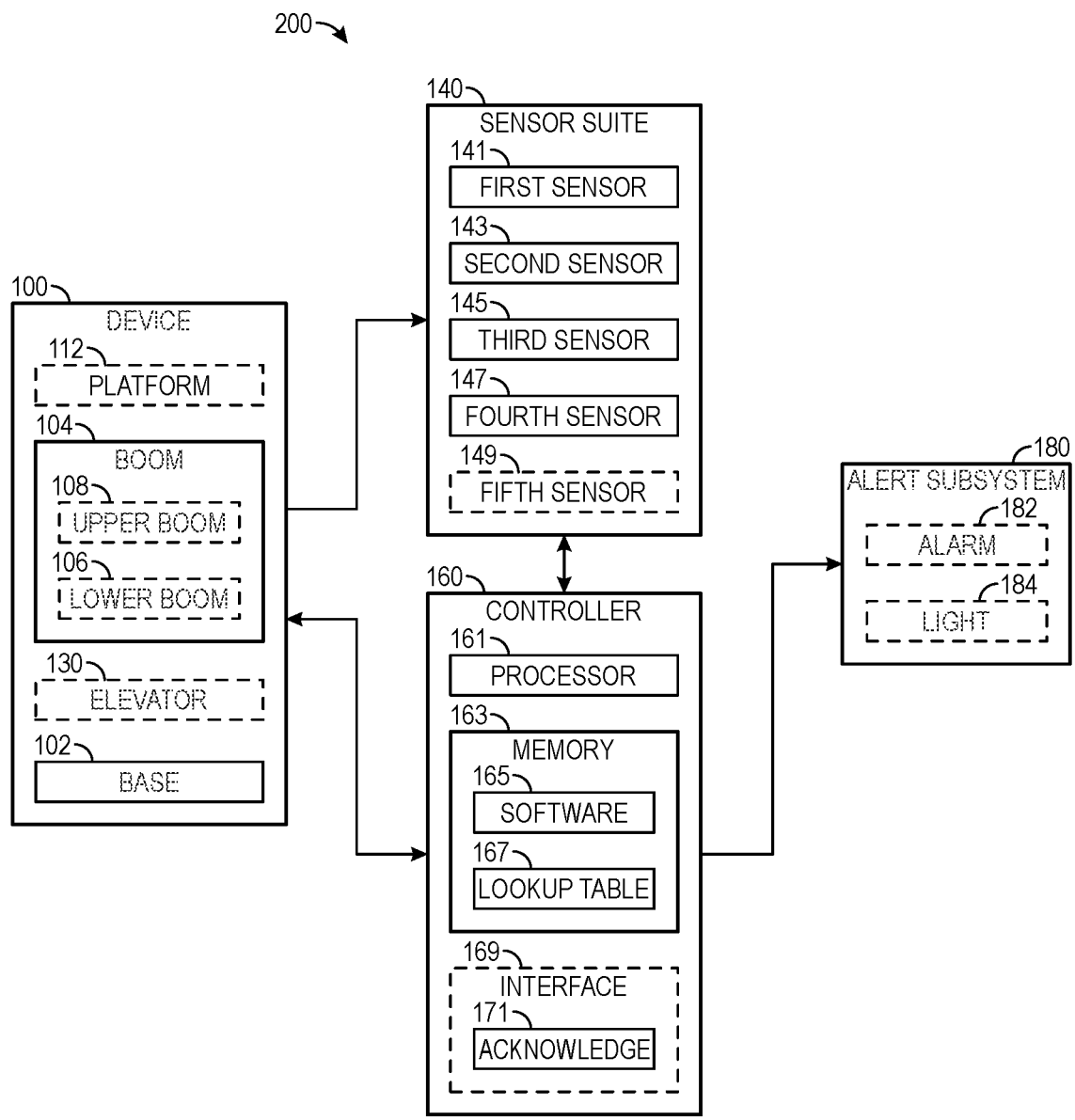
FIG. 3 illustrates a block diagram of an exemplary voltage and current alert system, in some embodiments.
Figure 4A:
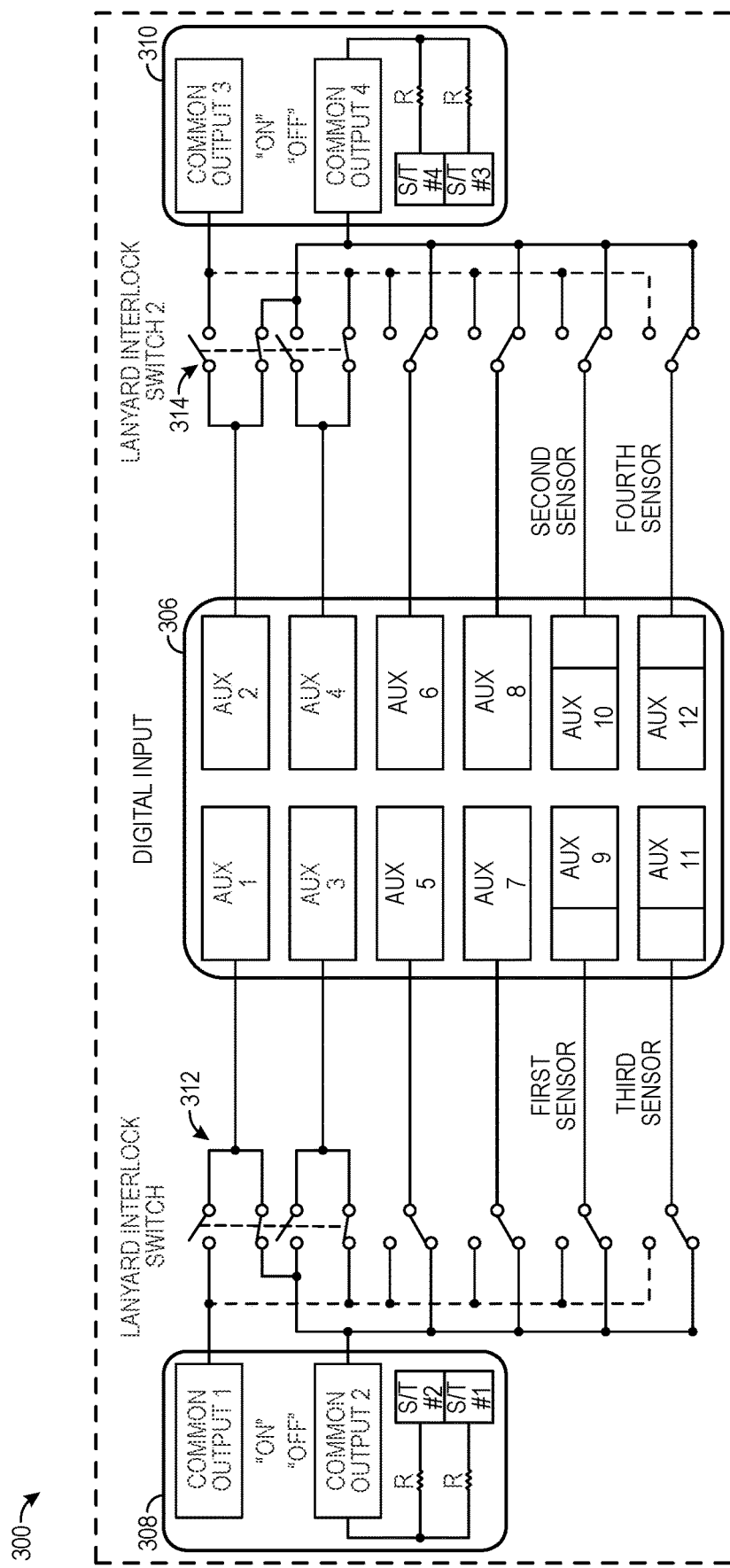
Figure 4B:
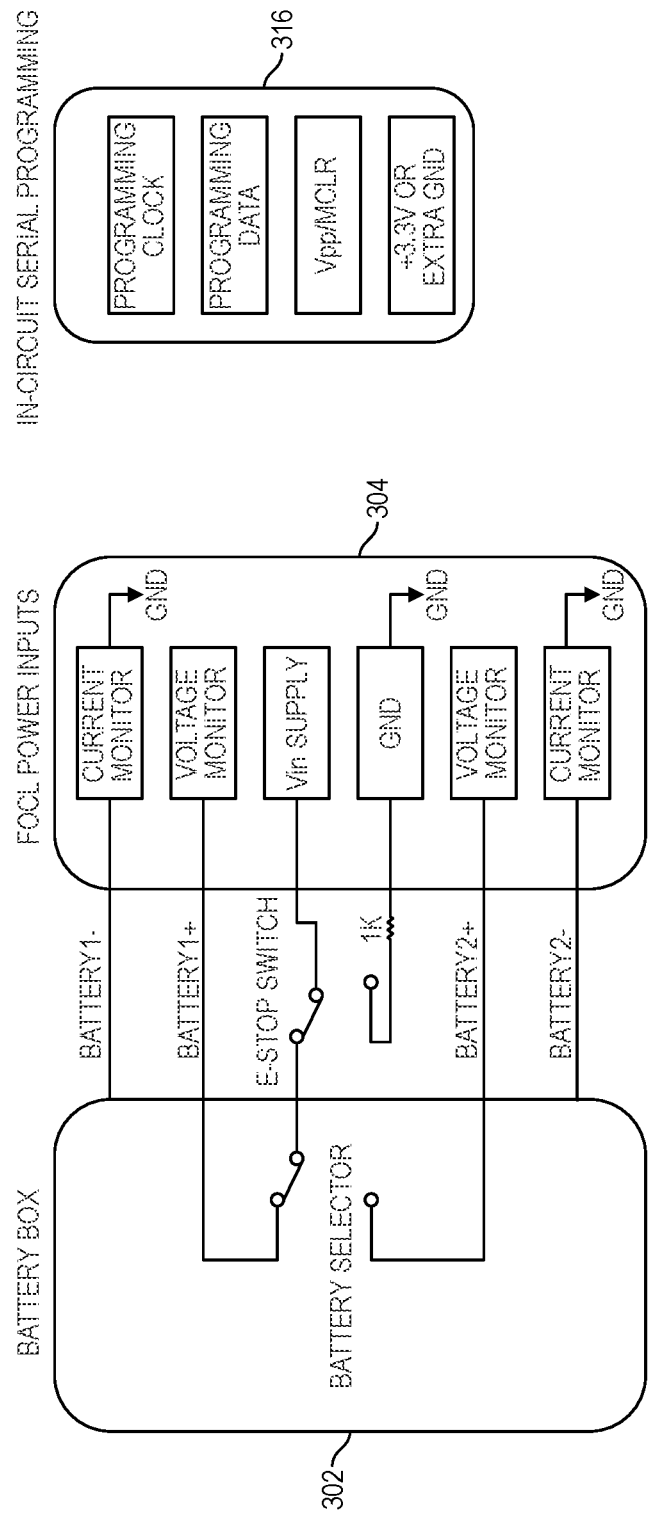
Figure 5A:
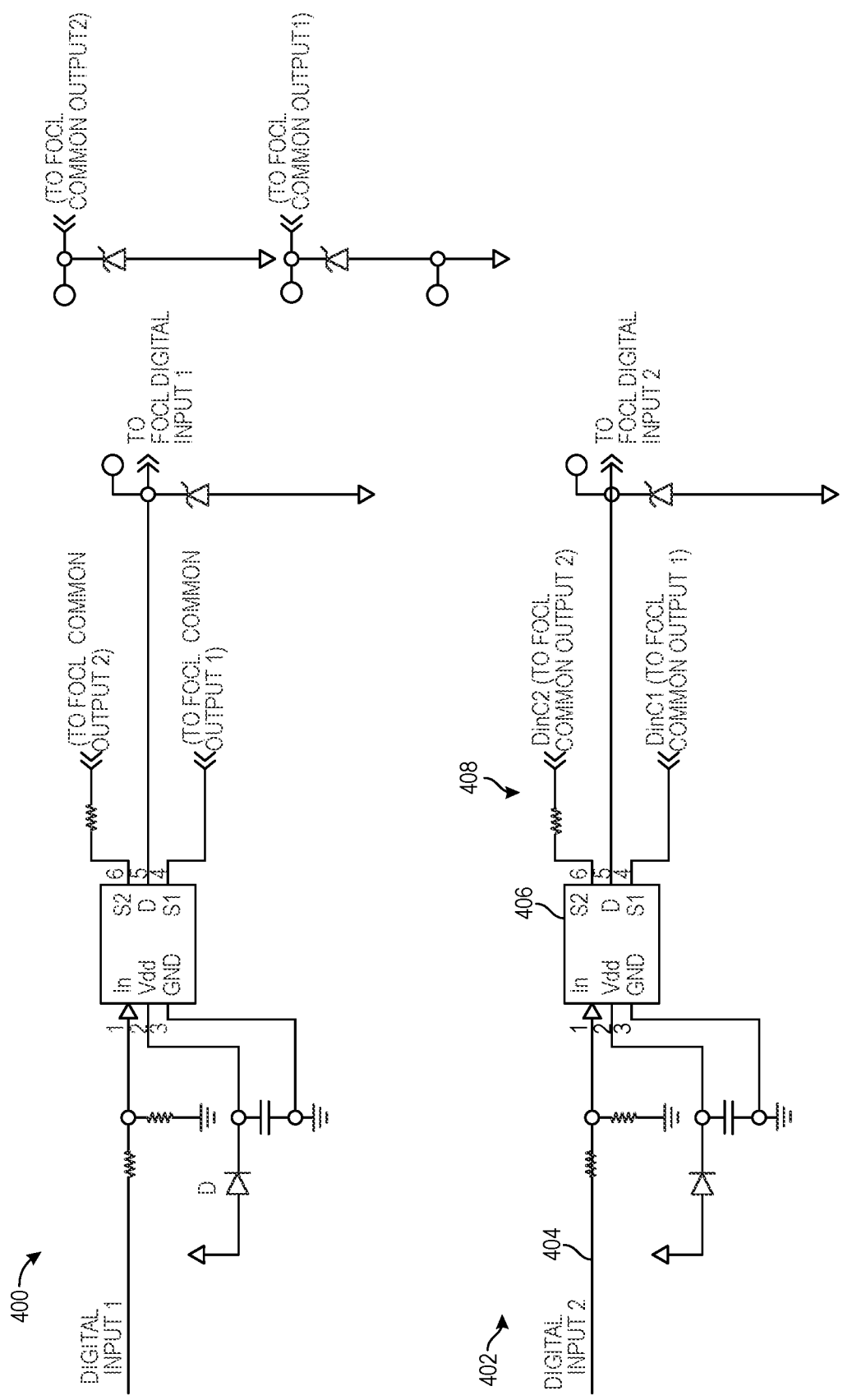
Figure 5B:
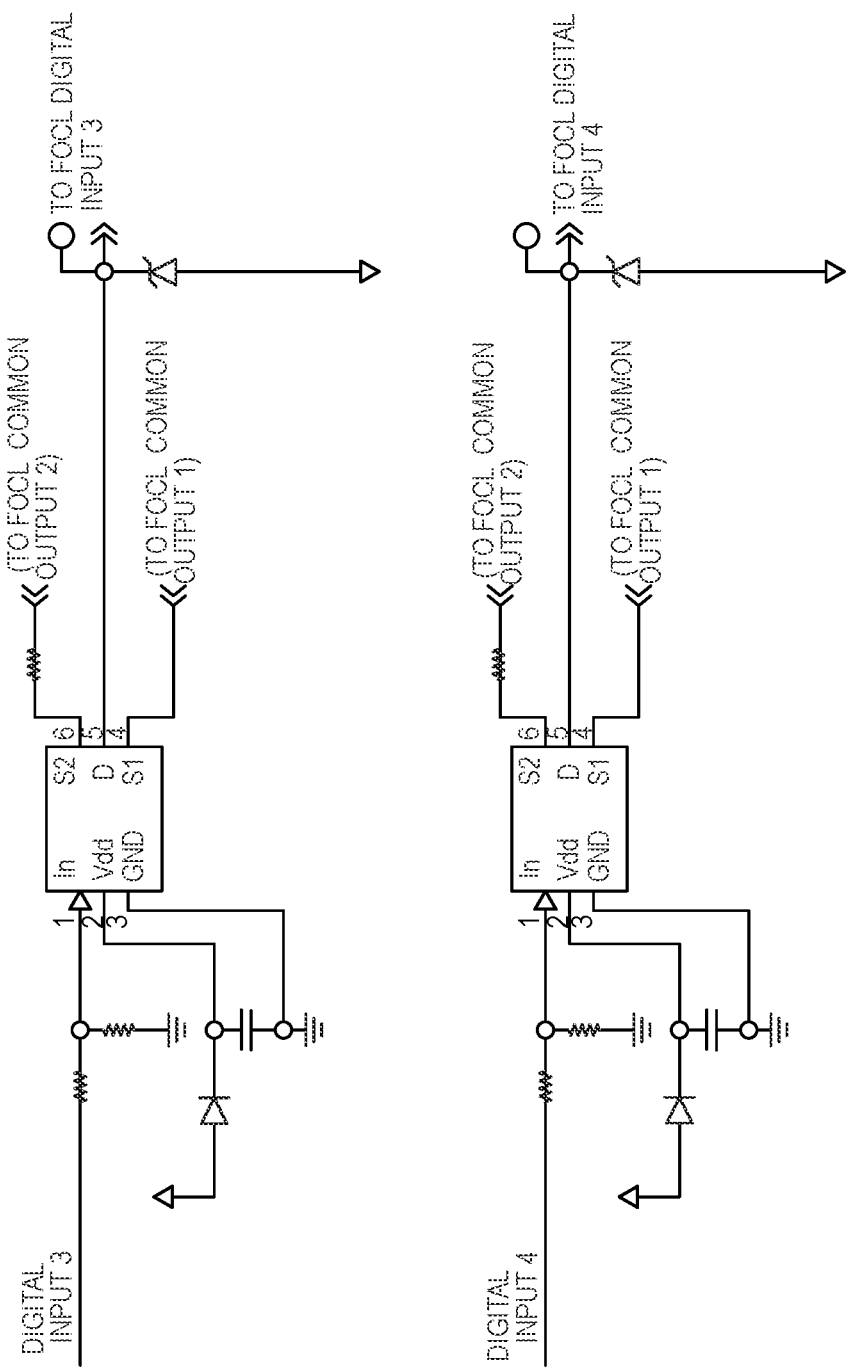
Figure 6A:
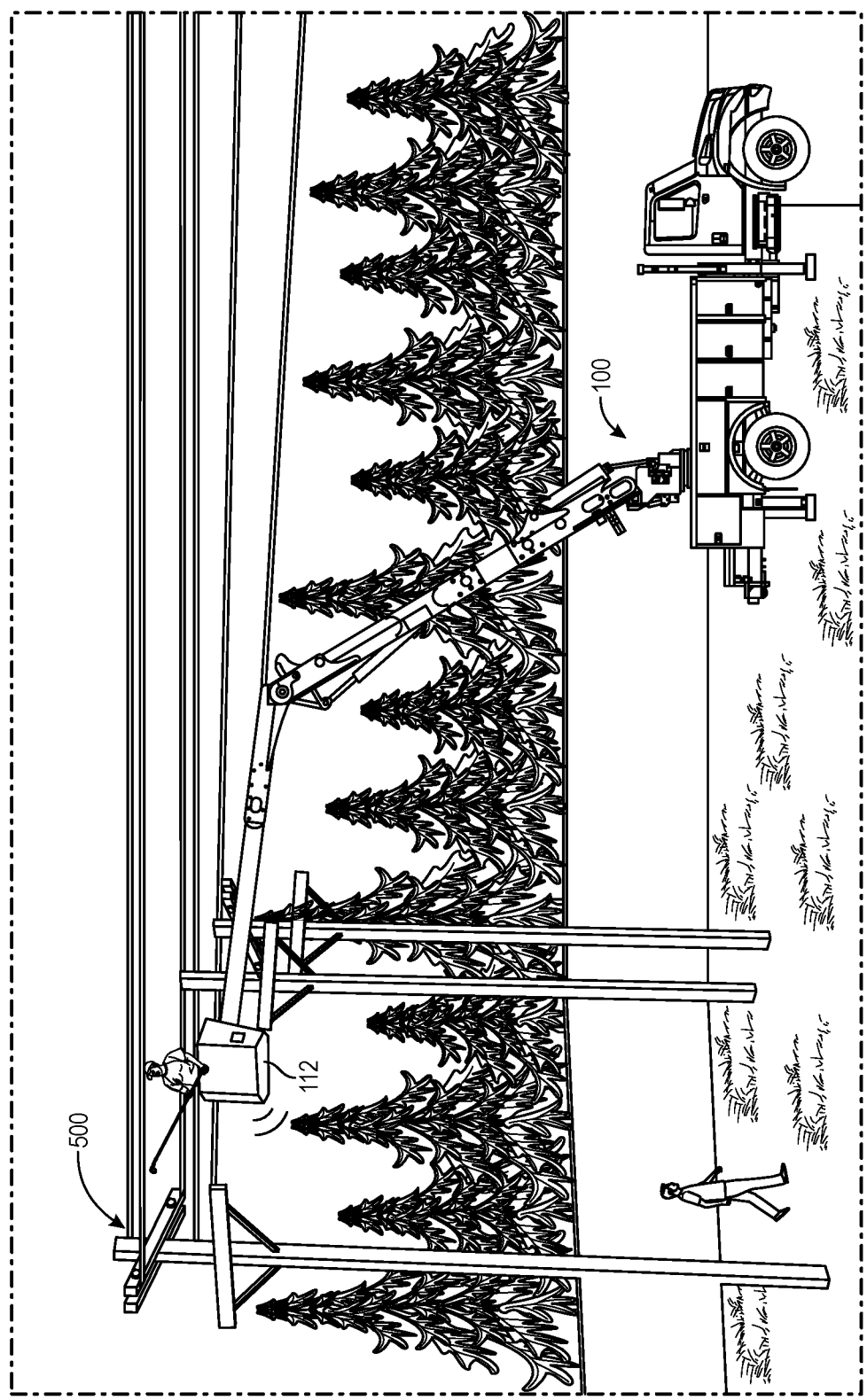
Figure 6B:
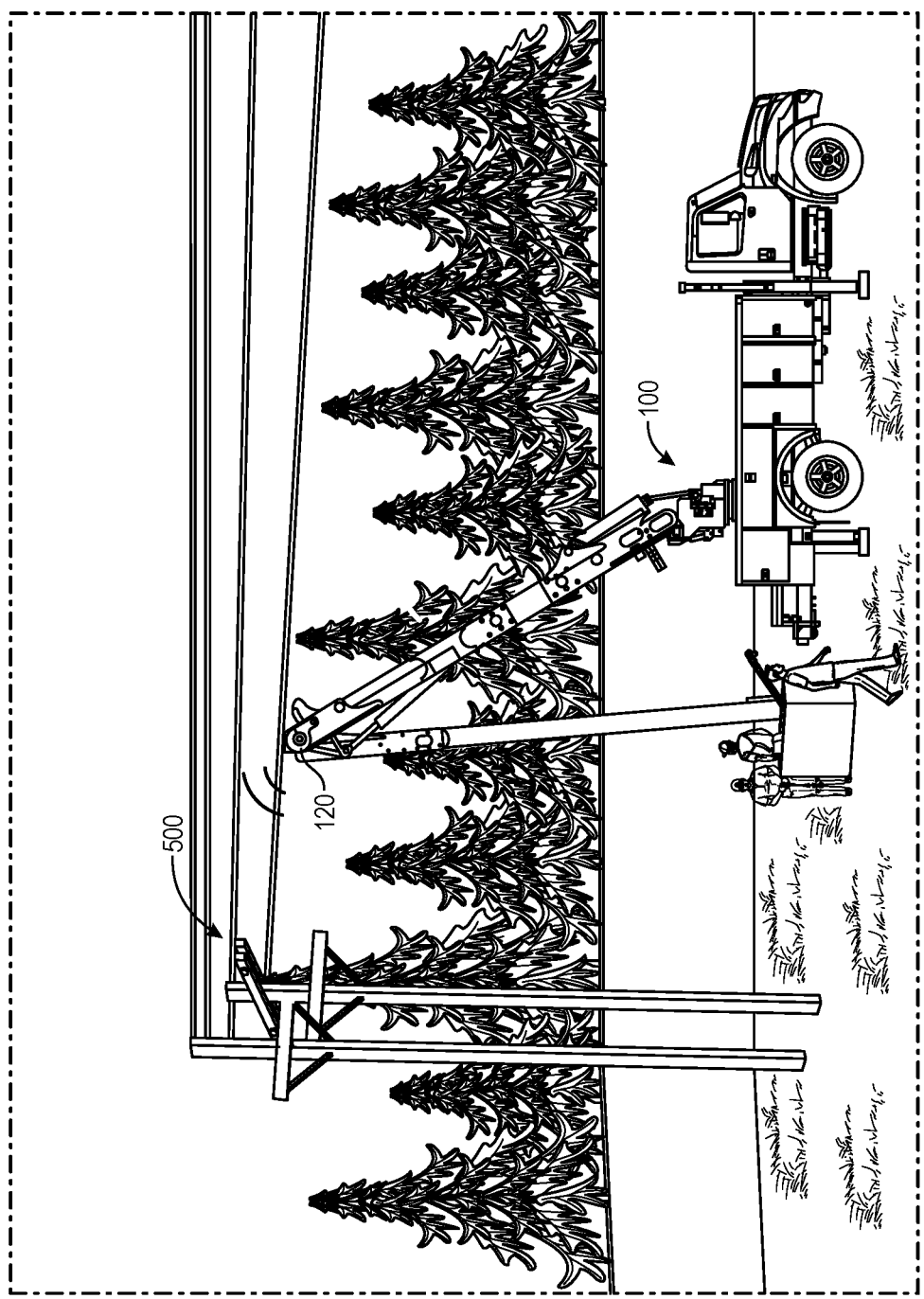
Figure 6C:
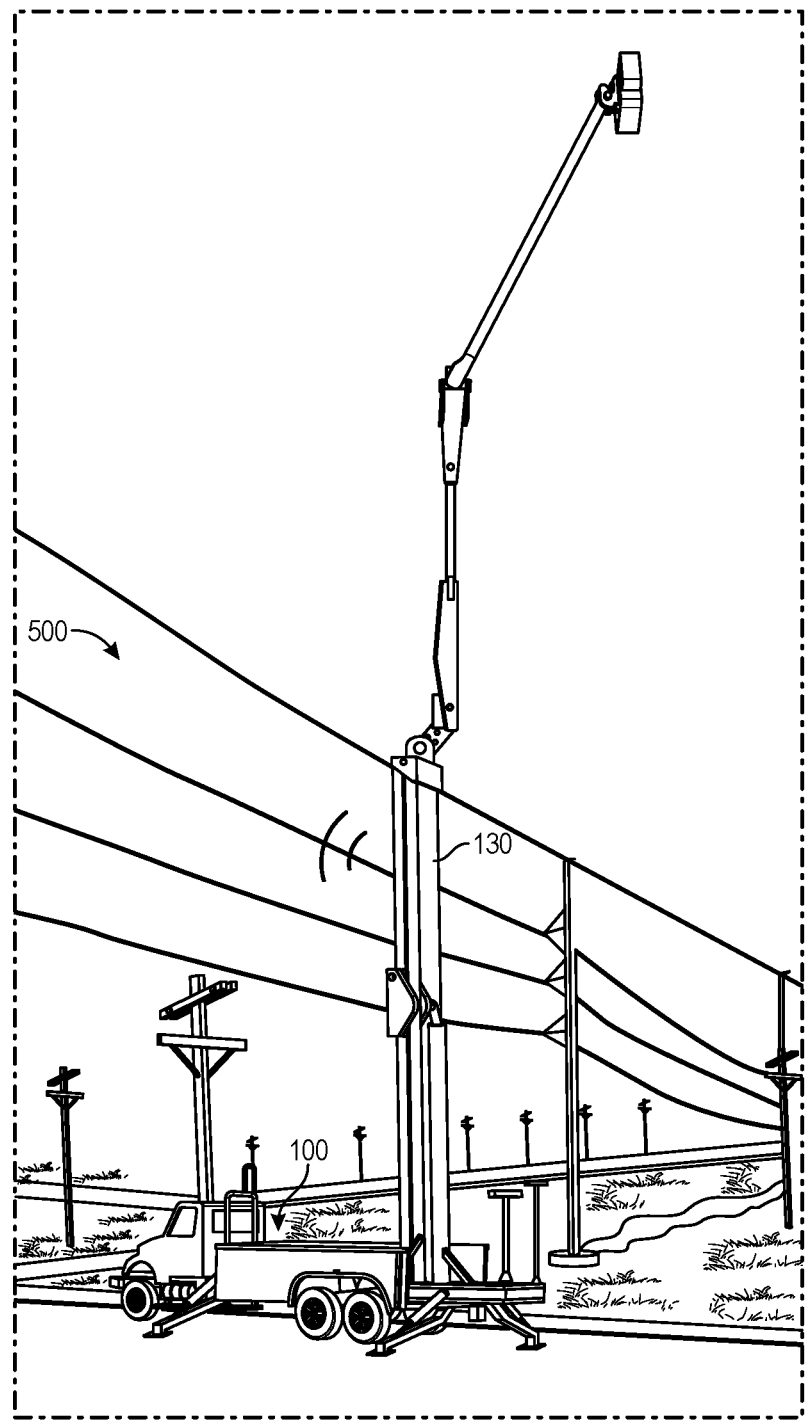
Figure 7:
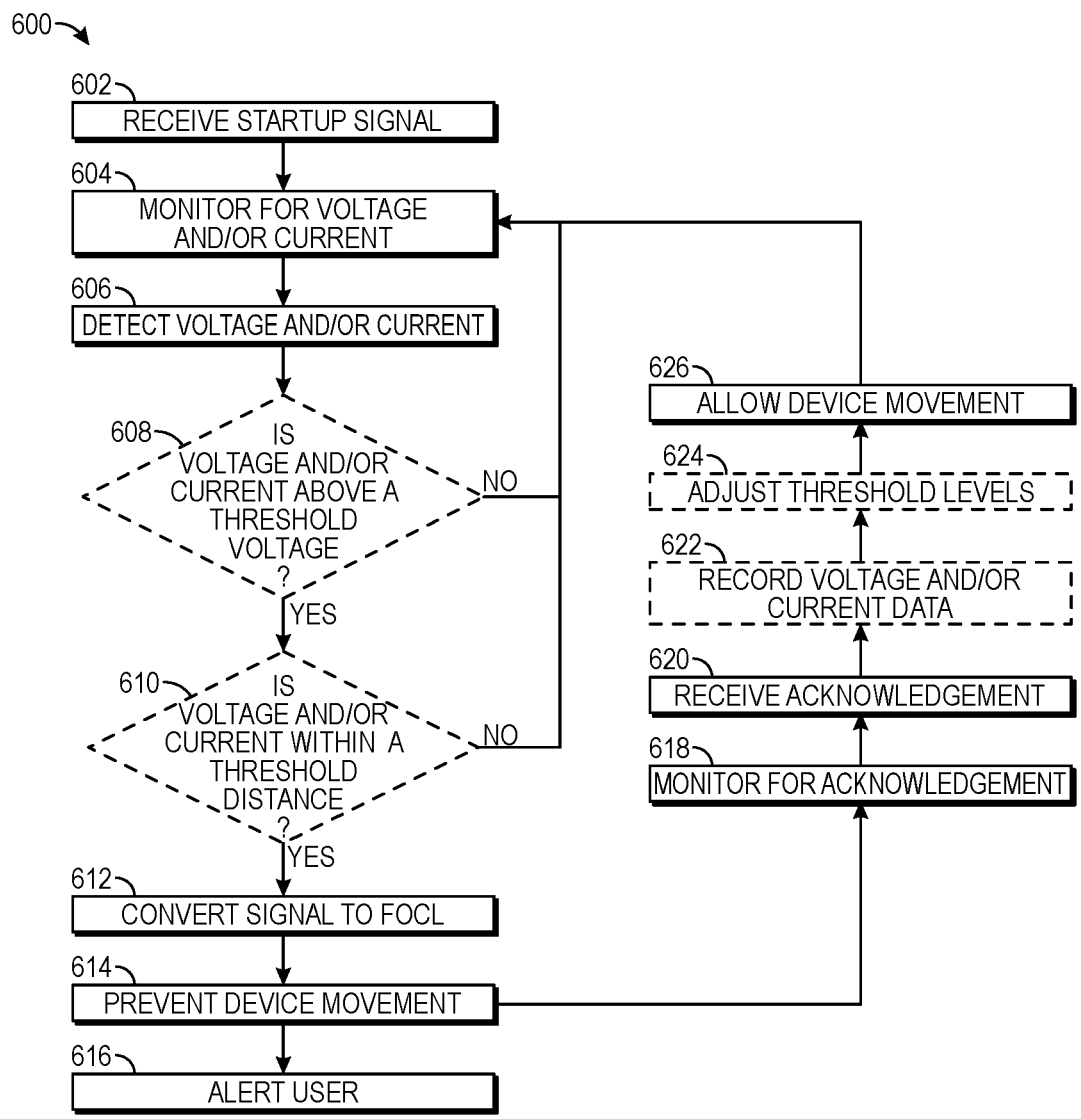

FIG. 4A-B illustrates an exemplary wiring subsystem of the voltage and current alert system of FIG. 3, in some embodiments;

FIG. 5A-B is a diagram of a conversion hardware of the voltage and current alert system of FIG. 3, in some embodiments;

FIGS. 6A-6C illustrate some exemplary situations in which the voltage and current alert system of FIG. 3 may operate; and FIG. 7 illustrates a voltage and current alert method, using certain aspects of the voltage and current alert system of FIG. 3, in some embodiments.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

Figure 1:
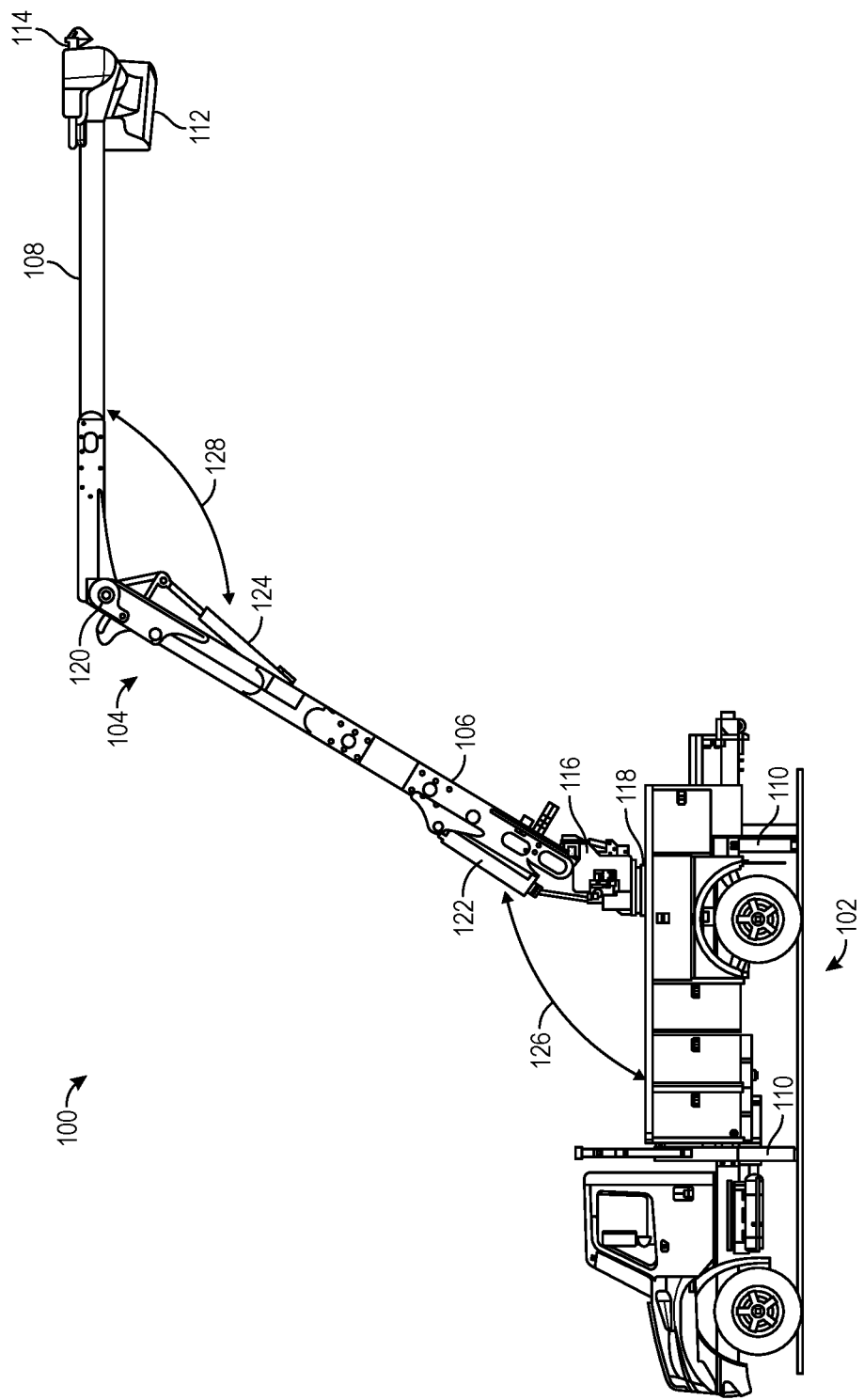
FIG. 1 is a side view of an aerial device depicted in some embodiments.

FIG. 1 shows a side view of an aerial device 100 comprising a voltage and current alert system of some embodiments. Similar components illustrated in different figures are enumerated with like numerals and may include alternative embodiments.

The aerial device 100 may include some sort of base that supports an extendable member configured for reaching (e.g., a boom 104). In the embodiment depicted in FIG. 1, the base 102 is a utility truck. In some embodiments, the base 102 may be a crane, a derrick digger, or any other base including an extendable member. In some embodiments, the boom 104 provides an extendable member for moving a platform 112. In some embodiments, the boom 104 may include a lower boom 106 and an upper boom 108. The base 102 provides a stable support, which may include outriggers 110, for supporting a load applied to the boom 104 and/or the platform 112. In an embodiment, the platform 112 includes a jib 114 configured for securing objects thereto. In some embodiments, the platform 112 may rotate to alter its orientation with respect to the boom 104. The boom 104 may fold into a collapsed position, which enables transporting via a mobile version of the base 102.

The boom 104 is mechanically coupled to, and configured to support, the platform 112. The optional platform 112 may be located at the distal end (with respect to the mobile base 102) of the upper boom 108. The upper boom 108 may include an optional telescoping arm (not shown) that extends from, and retracts within, the upper boom 108. The lower boom 106 may be mechanically coupled to a turntable 116 configured for rotating the boom 104. A pedestal 118 may be included to support the turntable 116 and is mechanically coupled to the base 102.

In operation, the platform 112 is raised by a combination of the lower boom 106 pivoting upwards, the upper boom 108 pivoting about an elbow 120, and the telescoping arm optionally extending out of the upper boom 108.

In an embodiment, the platform 112 is configured for hoisting a user into the air to, for example, work on a high-voltage powerline. Prior to extending the boom 104, the base 102 may be moved to an appropriate location and stabilized. The boom 104 may be rotated about the turntable 116, and extended upwards and outwards away from the base 102 by pivoting the lower boom 106, the upper boom 108, and by extending the telescoping arm. Various combinations of these movements may be employed to position the platform 112 around base 102. In some embodiments, movement of the platform 112 may be operated by a user located on the platform 112. In some embodiments, operation of the platform 112 may be controlled by an operator not located on platform 112 (e.g., on the ground). In both cases, the user may not be able to see all aspects of the moving portions of the boom 104 (e.g., elevator 130, lower boom 106, upper boom 108, elbow 120, etc.). Accordingly, certain components may, unbeknownst to the user, come within a dangerous proximity to a voltage or current source (e.g., a powerline, a telecommunications line, etc.). As will be discussed further below, voltage and current monitoring system 200 may, in some embodiments, be configured to warn a user or operator of a such a condition.

In certain embodiments, the upper boom 108 and any telescoping arm that may extend from upper boom 108 are electrically conducting. In these embodiments, the aerial device 100 may be configured to operate on certain objects which lack high voltage danger (e.g., low voltage telecommunication cables, tree cutting, etc.). In certain embodiments, the upper boom 108 and any telescoping arm that may extend from the upper boom 108 are electrically insulating (e.g., fiberglass) to enable safe operation near electrical power lines. Such an insulating composition may, in embodiments, be configured to protect a user within platform 112 or an operator near base 102 from an energized scenario in which a portion of boom 104 comes in contact or close proximity with a portion of a high voltage system. Such an insulating gap may require the use of electrically insulating signaling methods between base 102 and platform 112, such as fiber optic cables. As will be discussed below, voltage and current monitoring system 200 may be configured to function with both a non-insulated boom 104 and an insulated boom 104.

Aerial device 100 may include a first boom hydraulic cylinder 122 and a second boom hydraulic cylinder 124 configured to move certain components of boom 104. For example, first boom hydraulic cylinder 122 may be configured to move lower boom 106 around lower boom joint angle 126. In some embodiments, second boom hydraulic cylinder 124 may be configured to move upper boom 108 around upper boom joint angle 128.

As depicted in FIG. 6C, in some embodiments, aerial device 100 may include an elevator 130. In some embodiments, elevator 130 may be disposed between base 102 and lower boom 106. In some embodiments, elevator 130 may be configured to raise or lower boom 106 in a substantially vertical direction (e.g., direction 132).

FIG. 3 shows a block diagram of an exemplary voltage and current alert system 200. The voltage and current alert system 200 includes the aerial device 100, a sensor suite 140 having a plurality of sensors, a controller 160, and an alert subsystem 180. In certain embodiments, the aerial device 100 is an aerial device used to access elevated objects or otherwise difficult to reach items, such as those illustrated in FIGS. 1 and 2. The aerial device 100 includes a boom 104 that may be used to lift and move a user for work on substantially elevated objects, such as trees or powerlines.

Figure 2:
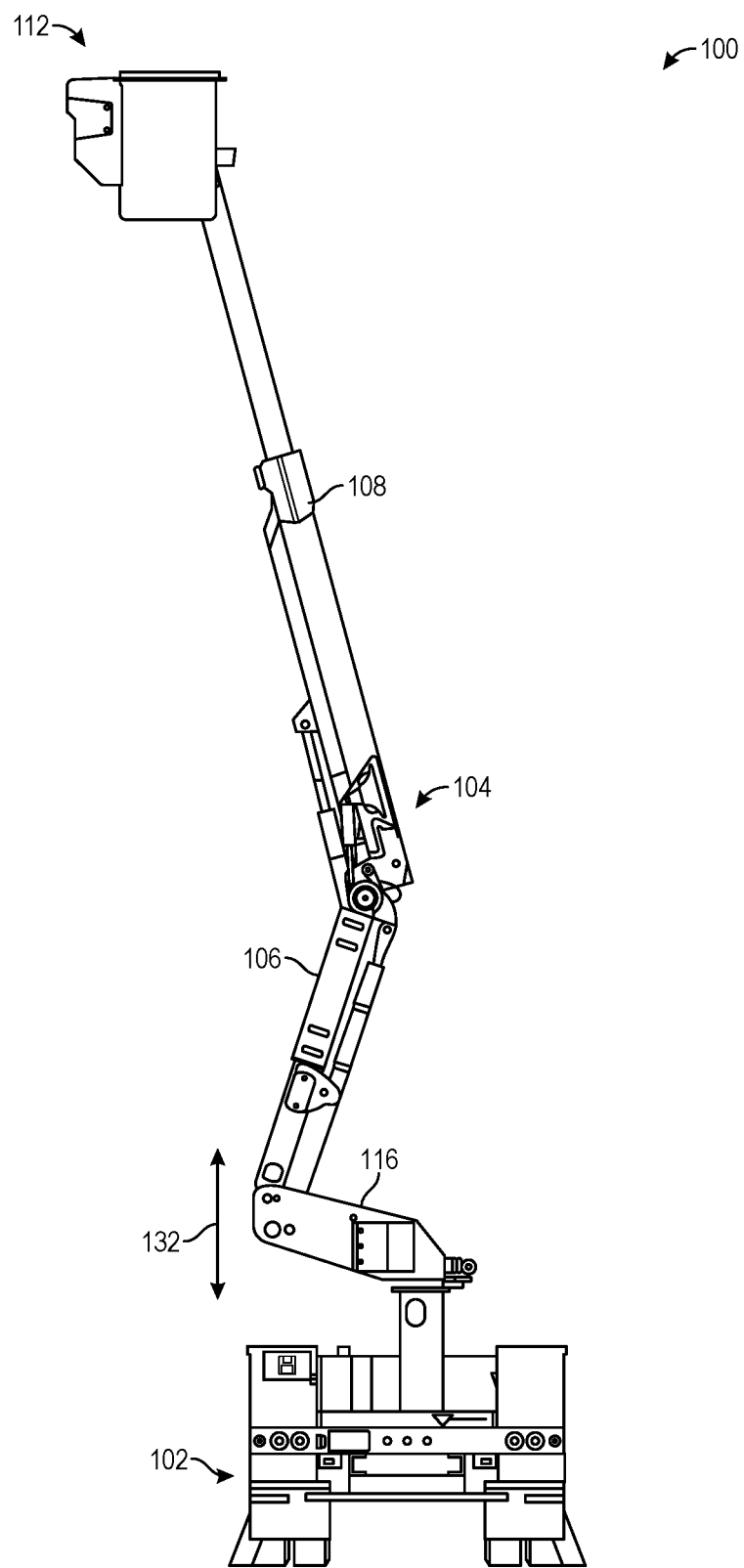
FIG. 2 is a rear view of an aerial device in some embodiments.

Boom 104 is rotatable and extendable. For extending its reach, in some embodiments the boom 104 may comprise a multi-segment boom having more than one segment. For example, as depicted in FIGS. 1-2, the boom 104 may include at least lower boom 106 and upper boom 108. The boom segments may be mechanically coupled in a variety of ways to enable various movements including but not limited to extending, contracting, raising, lowering, and rotating. For example, some boom segments may be pivotally coupled with joints for articulating, while other boom segments may be telescoping for extending/contracting. However, as mentioned, the boom 104 may include greater than two segments without departing from the scope hereof, such as elevator 130. Movement of the boom 104 may be by one or more hydraulic cylinders (e.g., first boom hydraulic cylinder 122, second boom hydraulic cylinder 124, etc.) mechanically coupled to segments of the boom 104, among other mechanical devices (e.g., cables).

A base 102 is provided to mechanically support the boom 104. The base 102 may be stationary (e.g., a fixed structure such as a crane or an oilrig) or mobile (e.g., an earth-working machine or a utility truck). In certain embodiments, the lower boom 106 may be mechanically coupled to the base 102, and the upper boom 108 may be mechanically coupled to the lower boom 106 via elbow 120 (see e.g., FIGS. 1-2).

An optional platform 112 may be mechanically coupled to a tip of the boom 104 at its distal end. In some embodiments, the base 102 may be mechanically coupled to a first end of the boom 104 (e.g., the proximal end), and the optional platform 112 may be mechanically coupled to a second end of the boom 104 (e.g., the distal end), opposite the first end. In some embodiments, the platform 112 may be configured to support one or more operators (e.g., in a utility bucket).

Operators working onboard platform 112, or workers within the vicinity of base 102, may be in danger of electrocution if any portion of boom 104 comes in contact with an energized part (i.e., a powerline). Often times, the operator may not be able to see portions of boom 104 that may come close to the energized part. As a non-limiting example, if an operator is on platform 112, and must operate above a tree, the operator may lose visibility of lower portions of the boom 104 (e.g., lower boom 106 or elevator 130) due to visual obstruction by the tree. In this case, a portion of boom 104, may be close to an electrical source without the knowledge of the operator. In this case, a detection and warning system such as voltage and current alert system 200, may decrease the chances of such a scenario by warning the operator of a close contact of boom 104, or other portions of aerial device 100, with an energized part.

Traditional means of preventing electrocution of workers either on platform 112 or in contact with base 102 involve visual inspection by the workers of the surroundings. Additional safeguards, such as electrically insulating boom 104, have been undertaken. However, as mentioned above, visual inspection is not always possible by an operator. Furthermore, even an insulated boom 104 runs the risk of becoming energized due to electrically conducting materials being required on some portions of boom 104 (e.g., first boom hydraulic cylinder 122, second boom hydraulic cylinder 124, etc.).

An objective of the presently disclosed voltage and current alert system 200 and method 600 is to reduce the power requirements needed to alert a user or operator of a proximity warning of an energized part, therein extending the operating life of voltage and current alert system 200.

Returning to FIG. 3, the sensor suite 140 sends one or more signals indicative of voltage or current proximity nearby the aerial device 100 to the controller 160. In some embodiments, the controller 160 determines aspects of the voltage or current proximity based on the signals received from the plurality of sensors of sensor suite 140.

The sensor suite 140 includes a plurality of sensors for monitoring voltage or current proximity nearby different portions of aerial device 100. The plurality of sensors may comprise a hall sensor, a reed switch, or any other voltage or current sensor known to one of ordinary skill in the art. The plurality of sensors may be disposed at different locations along aerial device 100, which will be discussed in greater detail below.

In some embodiments, a first sensor 141 may be configured to monitor voltage proximity nearby the platform 112. The platform 112 may regularly come within a close range of a voltage or current source (i.e., energized part), for example, if an operator is working on a powerline from the platform 112. In some embodiments, a second sensor 143 may be configured to monitor voltage proximity nearby the upper boom 108. The upper boom 108 may come into close contact with a voltage or current source, for example, if an operator is removing tree branches located above a powerline. In some embodiments, a third sensor 145 may be configured to monitor voltage proximity nearby the elbow 120. In some embodiments, a fourth sensor 147 may be configured to monitor voltage proximity nearby the lower boom 106. In some embodiments, an optional fifth sensor 149 may be configured to monitor voltage proximity nearby the elevator 130. While sensor suite 140 is depicted here as comprising five sensors, any number (e.g., one, two, three, four, five, six, seven, eight, nine, ten, eleven, twelve, etc.) of sensors may be disposed along aerial device 100 without departing from the scope disclosed herein.

The plurality of sensors may be configured to detect various ranges of voltages or currents and/or distances away from the voltage or current source. For example, in some embodiments, the plurality of sensors in sensor suite 140 may be configured to detect only high voltage sources (e.g., between about 60 kV to about 500 kV). In some embodiments, the plurality of sensors in sensor suite 140 may be configured to detect lower to middle range voltage sources (e.g., between about 120 volts to about 500 kV). In some embodiments, the plurality of sensors in sensor suite 140 may be configured to detect voltage or current sources within a distance of between about 1 foot to about 25 feet. In some embodiments, the plurality of sensors in sensor suite 140 may be configured to detect voltage or current sources within a distance of between about 2 feet to about 12 feet. In some embodiments, each sensor within sensor suite 140 may be configured differently to have a different threshold level for voltage or current as well as distance from the source. In some embodiments, the detection distance of the plurality of sensors of sensor suite 140 may be a function of the voltage produced by the source. For example, a sensor may be able to detect a voltage of about 100 kV from a distance of about 10 feet whereas the sensor may be able to detect a voltage of about 10 kV from a distance of about 5 feet.

The information from the sensor suite 140 may be provided continuously or at regular intervals to controller 160. Alternatively, the controller 160 may send a request for information from the sensor suite 140 at any instance or according to any schedule. Communication between the controller 160, the aerial device 100, and the sensor suite 140 may be via a wired and/or wireless communication media. For example, the controller 160 may include a transceiver (e.g., a transmitter/receiver), a multi-channel input/output (I/O) data bus, or the like (not shown) for communicatively coupling with the plurality of sensors (e.g., sensors 141, 143, 145, 147, 149). Similarly, individual sensors of the sensor suite 140 may include a wireless transceiver, or the individual sensors may be wired to a multi-channel I/O data bus, or the like (not shown) for communicatively coupling the plurality of sensors with the controller 160. In some embodiments, individual sensors of the sensor suite 140 may include a fiber optics communication system for coupling the plurality of sensors with the controller 160. In these embodiments, the use of a fiber optics communication system may require less power to operate, therein allowing the device to sustain power for a longer duration of time (e.g., years) from a single power source (e.g., a battery).

In various embodiments, the controller 160 samples, receives, or otherwise acquires voltage proximity information from the sensor suite 140 occasionally, periodically, continuously, or substantially continuously. Additionally, or alternatively, the controller 160 may be sampling, receiving, or otherwise acquiring voltage proximity indications only upon the presence of certain conditions. For example, the system 200 may have an idle mode in which the controller 160 is idle.

Signals from at least one sensor of the sensor suite 140 may be filtered to remove signal noise. For example, the signals may include oscillations or other signal spikes that could produce false-positive alerts. In an embodiment, a low-pass filter is tuned to oscillations of the low level voltages or current anomalies for filtering the signals. Alternatively, an exponential filter, a moving-average filter, or a finite impulse response (FIR) filter may be used.

Based on information from the plurality of sensors of the sensor suite 140 and the lookup tables 167, the controller 160 may determine a voltage or current proximity alert threshold. The lookup tables 167 provide predetermined information about the system 200 in the form of at least one set or matrix of data, as further described below.

The controller 160 is for example a computer, microcontroller, microprocessor, or programmable logic controller (PLC) having a memory 163, including a non-transitory computer-readable medium for storing software 165, and a processor 161 for executing instructions of the software 165. An example of software instructions includes steps of the voltage and current alert method 600, described below in connection with FIG. 5. The controller 160 is not limited by the materials from which it is formed, or the processing mechanisms employed therein and, as such, may be implemented via semiconductor(s) and/or transistors (e.g., electronic integrated circuits (ICs)), and so forth. It should also be appreciated that the discussed functions and methods performed by the controller 160 may be performed by other processors.

In some embodiments, the controller 160 may be disposed on any portion of the aerial device 100 or may be remote therefrom. In some embodiments, the controller 160 may be disposed on the base 102 of aerial device 100. In some embodiments, the controller 160 may be disposed on the turntable 116 of aerial device 100. In some embodiments, the controller 160 may be disposed on the boom 104 of aerial device 100. In some embodiments, the controller 160 may be disposed on the platform 112 of aerial device 100. In some embodiments, there may be more than one controller 160 disposed on aerial device 100. In these embodiments, the more than one controller 160 may be operatively connected for communication therebetween.

The controller 160 may further include an optional interface 169 for the user to transmit instructions and receive information. In an embodiment, the optional interface 169 includes an acknowledgement 171 that enables an operator to acknowledge a detection event, thereby resetting the voltage and current alert system 200 (e.g., following a visual inspection of the aerial device 100). In some embodiments, the acknowledgement 171 includes a button, lever, interactive display, or any other form of indication allowing a user to notify controller 160 that he or she acknowledges the detection event. In some embodiments, the interface 169 includes a hand-held control stick (e.g., a joystick or sidestick controller) and/or one or more buttons for moving boom 104 to position components of the aerial device 100 (e.g., the platform 112). In other embodiments, the interface 169 includes a computer, a touch screen, or a mobile device.

The alert subsystem 180 may provide an alert that informs an operator of the aerial device 100 of a potential unsafe situation, such as a voltage proximity, as described below in connection with the method 600, FIG. 7. The alert subsystem 180 may include alert devices to produce the alert such as audible alarm 182, a visual indication, such as light 184, display device, a speaker system, a headphone worn by the operator, a buzzer, light sources (e.g., multi-colored lights), or other similar alerting mechanisms. Alert subsystem 180 may, in some embodiments, comprise alert devices (e.g., alarm 182, light 184, etc.) disposed at different portions of aerial device 100. For example, alert subsystem 180 may, in some embodiments, have an alert device disposed at one or more of base 102, boom 104, platform 112, etc. In some embodiments, the form of the alert device may be different based on the location. For example, an alarm 182 disposed on the platform 112 may turn red and flash upon a detection event whereas an alarm 182 disposed on the base 102 may turn blue and flash upon a detection event. In some embodiments, the alert subsystem 180 may alternatively activate alert devices based on one or more of voltage level, current level, distance to the energized part, direction of the energized part, etc. In some embodiments, alert subsystem 180 may alter one or more alert devices as the detection changes. For example, an audible noise from an alarm 182 may increase in volume or a light may become brighter or flash faster as a portion of aerial device 100 comes closer to an energized part.

FIG. 4A-B is an exemplary wiring subsystem 300 illustrating connectivity of voltage and current alert system 200, in some embodiments. In some embodiments, wiring subsystem 300 includes a power source 302 to power the subsystem. Power source 302, in some embodiments, may include any number of power supplies that may feasibly power the subsystem. For example, in some embodiments, power source 302 may comprise a battery. Power source 302 may operatively connect to power input 304 to power one or more portions of voltage and detection alert system 200.

In some embodiments, wiring subsystem 300 includes one or more digital inputs 306. Digital inputs 306, in some embodiments, comprise inputs for receiving signals regarding specific components of aerial device 100.

In some embodiments, digital inputs 306 may operatively connect to one or more common outputs 308, 310. Common outputs 308, 310, may be configured to control certain functions of aerial device 100. For example, in some embodiments, common outputs 308, 310 may include on/off switches which may prevent operation of certain components of aerial device 100. In some embodiments, common outputs 308, 310 may prohibit a user to adjust aspects of aerial device 100 (e.g., boom 104, platform 112, elevator 130, etc.) if voltage and current alert system 200 identifies a voltage or current proximity as described above.

In some embodiments, digital inputs 306 may connect to the one or more common outputs 308, 310 via switches 312, 314. Switches 312, 314 may, in some embodiments, comprise one or more of single pole single throw (SPST) switches, single pole double throw (SPDT) switches, or any other electrical switch that allows wiring subsystem 300 to alter common outputs 308, 310.

In some embodiments, wiring subsystem 300 may include serial programming 316. Serial programming 316 may include one or more of a programming clock, programming data, a peak-to-peak voltage (Vpp), a master clear pin external reset (MCLR), and/or a ground. In some embodiments, serial programming 316 may be configured to allow wiring subsystem 300 to be programmed while installed in aerial device 100 or voltage and current alert system 200.

FIG. 5A-B is an exemplary diagram of conversion hardware 400 illustrating some embodiments of digital signal conversion to low power signals that can be used by the voltage and current alert system 200. As mentioned previously, aspects of conversion hardware 400 may, in some embodiments, be implemented into wiring subsystem 300 (e.g., at switches 312, 314). In some embodiments, conversion hardware 400 may include one or more conversion switches 402. FIG. 5A-B depicts conversion hardware 400 having four conversion switches 402, however there may be any number of conversion switches 402 included into conversion hardware 400. For example, conversion hardware 400 may include one, two, three, four, five, six, seven, eight, or more conversion switches 402. In some embodiments, conversion hardware 400 may be configured to provide graded fiber optic signals to provide more detailed information by having more than one conversion switch 402. For example, multiple conversion switches 402 may be utilized together as a matrix to send detailed detection data regarding a voltage proximity, such as voltage intensity, voltage direction, voltage distance, etc.

Conversion switches 402 of conversion hardware 400 may be configured to convert high power digital signals into lower power signals that can be process by the fiber optic system. For example, in some embodiments, conversion switches 402 may receive digital signals from digital input 306 at input 404. The digital signal may travel from input 404 into switch 406. Switch 406 may comprise an analog switch. In some embodiments, switch 406 may comprise an integrated chip analog switch, such as a SPST or SPDT switch. As illustrated in FIG. 5A-B, switch 406 is a 6 pin analog switch. However, it is to be understood that in some embodiments switch 406 may include any number of pins (e.g., four, six, eight, ten, twelve, fourteen, sixteen, etc.). In some embodiments, switch 406 may be operatively connected to common outputs 308, 310 via outputs 408.

Turning now to FIGS. 6A-6C, depicted are some exemplary detection events in which voltage and current alert system 200 may warn an operator of a voltage or current detection nearby the aerial device 100. For example, FIG. 6A illustrates a scenario in which the platform 112 of aerial device 100 comes into close proximity (e.g., 8 feet) of an energized part 500 (e.g., a powerline). In this example, controller 160, via a sensor (e.g., first sensor 141), receives a signal indicating that a voltage source of a specified level (e.g., 100 kV) has been detected. Controller 160 may then determine via lookup table 167 or other means that such a voltage within a certain distance is above a predetermined threshold. In some embodiments, controller 160 may activate alert subsystem 180 to alert the user of a voltage or current proximity (i.e., detection event). In some embodiments, alert subsystem 180 may notify one or more users which portion of the aerial device 100 is within close proximity (i.e., platform 112). In some embodiments, controller 160 may shut down some or all of operations of aerial device 100. In some embodiments, a user may be unable to actuate any portion of aerial device 100 for a specified amount of time following the detection event. For example, controller 160 may prevent activation of first boom hydraulic cylinder 122 and second boom hydraulic cylinder 124. In some embodiments, controller 160 may prevent activation of the elevator 130. In some embodiments, controller 160 may require a user to sufficiently acknowledge, via acknowledgement 171, the detection event. For example, a user may be required by controller 160 to push, press, hold, etc. acknowledgement 171 for a specified amount of time (e.g., three seconds) to resume operations of aerial device 100.

In another example, FIG. 6B illustrates a scenario in which the elbow 120 of aerial device 100 comes into close proximity (e.g., 5 feet) of the energized part 500. In this example, controller 160, via a sensor (e.g., third sensor 145), receives a signal indicating that a voltage source of a specific level (e.g., 200 kV) has been detected. Controller 160 may then determine via lookup table 167 or other means that such a voltage within a certain distance is above a predetermined threshold. In some embodiments, controller 160 may activate alert subsystem 180 to alert the user of a detection event. In some embodiments, alert subsystem 180 may notify one or more users which portion of the aerial device 100 is within close proximity (i.e., elbow 120). In some embodiments, controller 160 may shut down some or all of operations of aerial device 100. In some embodiments, a user may be unable to actuate any portion of aerial device 100 for a specified amount of time following the detection event. For example, controller 160 may prevent activation of first boom hydraulic cylinder 122 and second boom hydraulic cylinder 124. In some embodiments, controller 160 may prevent activation of the elevator 130. In some embodiments, controller 160 may require a user to sufficiently acknowledge, via acknowledgement 171, the detection of a voltage or current proximity. For example, a user may be required by controller 160 to push, press, hold, etc. acknowledgement 171 for a specified amount of time (e.g., two seconds) to resume operations of aerial device 100.

In another example, FIG. 6C illustrates a scenario in which the elevator 130 of aerial device 100 comes into close proximity (e.g., 12 feet) of the energized part 500. In this example, controller 160, via a sensor (e.g., fifth sensor 149), receives a signal indicating that a voltage source of a specific level (e.g., 30 kV) has been detected. Controller 160 may then determine via lookup table 167 or other means that such a voltage within a certain distance is above a predetermined threshold. In some embodiments, controller 160 may activate alert subsystem 180 to alert the user of a detection event. In some embodiments, alert subsystem 180 may notify one or more users which portion of the aerial device 100 is within close proximity (i.e., elevator 130). In some embodiments, controller 160 may shut down some or all of operations of aerial device 100. In some embodiments, a user may be unable to actuate any portion of aerial device 100 for a specified amount of time following the detection event. For example, controller 160 may prevent activation of first boom hydraulic cylinder 122 and/or second boom hydraulic cylinder 124. In some embodiments, controller 160 may prevent activation of the elevator 130. In some embodiments, controller 160 may require a user to sufficiently acknowledge, via acknowledgement 171, the detection of a voltage or current proximity. For example, a user may be required by controller 160 to push, press, hold, etc. acknowledgement 171 for a specified amount of time (e.g., five seconds) to resume operations of aerial device 100.

It is noted that FIGS. 6A-6C are intended for exemplary purposes only and by no means should be construed as limiting the scope of the invention disclosed herein. It will be clear to one skilled in the art that voltage and current alert system 200 may alert a user of a detection event of an energized part 500 nearby aerial device 100 in a plethora of varying scenarios.

FIG. 7 illustrates a voltage and current alert method 600, using certain aspects of aerial device 100 and voltage and current alert system 200, in some embodiments.

In a step 602, a startup signal is received. In an example of step 602, a controller (e.g., controller 160) receives a signal to initiate the voltage and current alert system 200. In some embodiments, the startup signal may be provided by a user of aerial device 100. In some embodiments, the controller 160 may be configured to monitor use of aerial device 100. Accordingly, use of aerial device 100 in certain facets may provide the startup signal for controller 160.

In a step 604, fields of voltage and/or current are monitored for. In an example of step 604, a controller (e.g., controller 160) via one or more sensors (e.g., sensor suite 140) may monitor for detection of a voltage and/or current source. Such a source, in some embodiments, may be detected from an energized part (e.g., energized part 500). In some embodiments, one or more aspects of an aerial device (e.g., aerial device 100) may be monitored. For example, different aspects of aerial device 100 (e.g., elevator 130, lower boom 106, elbow 120, upper boom 108, platform 112, etc.) may be monitored for voltage or current detection via one or more sensors (i.e., sensor suite 140) located substantially close to each component.

In a step 606, voltage is detected. In an example of step 606, a sensor (e.g., first sensor 141) detects a voltage and/or current, such as a voltage from an energized part (e.g., energized part 500). In some embodiments, the voltage and/or current detected may be of a specific voltage/current and/or a specific distance away from a component of aerial device 100. In some embodiments, the one or more sensors (e.g., sensor suite 140) may be configured to detect certain voltage ranges. In some embodiments, the one or more sensors (e.g., sensor suite 140) may be configured to detect a voltage and/or current change within a range of distances away from a component of aerial device 100.

Step 608 is an optional decision to determine if the measured voltage and/or current is above a threshold voltage. In an example of step 608, a controller (e.g., controller 160) determines via signals from sensors (e.g., sensor suite 140) the level of voltage and/or current that has been detected. Controller 160 may then compare this measured voltage and/or current level with a threshold level to determine if the measured voltage and/or current is above the threshold level (i.e., measured voltage and/or current level is considered dangerous). In some embodiments, controller 160 may use one or more of memory 163 or lookup table 167 to determine the threshold level. If in step 608, the measured voltage and/or current is determined to be below the threshold voltage and/or current, then voltage and current alert method 600 may proceed back to step 604 to continue to monitor for voltage and/or current. If in step 608, the measured voltage and/or current is determined to be above the threshold voltage, then voltage and current alert method 600 may proceed to optional step 610 or step 612.

Step 610 is an optional decision to determine if the detected voltage and/or current is within a threshold distance. In an example of step 610, a controller (e.g., controller 160) determines via signals from sensors (e.g., sensor suite 140) the distance from a component of aerial device 100 and the energized part (e.g., energized part 500). In some embodiments, the plurality of sensors within sensor suite 140 may be configured to provide information to controller 160 regarding the distance from the sensor to the voltage or current source (e.g., energized part 500). The controller 160 may then compare the measured distance to the voltage and/or current source against a threshold distance (i.e., the distance at which it is dangerous to come within to the voltage or current source). This comparison may include information from optional step 608 in determining the threshold allowable distance. For example, if a voltage of 10 kV is detected, the threshold allowable distance may be smaller than the threshold allowable distance if a voltage of 100 kV is detected. If in step 610 the controller 160 determines the measured distance is larger than the threshold value, then method 600 may proceed back to step 604 to continue monitoring for voltage and/or current. If in step 610 the controller 160 determines the measured distance is smaller than the threshold value, then method 600 may proceed to step 612.

In step 612, the digital signal is converted to a fiber optic control low power (FOCL) signal. In an example of step 612, the signal from a digital input (e.g., digital input 306) going to a common output (e.g., common outputs 308 and 310) is converted to a FOCL signal using a conversion hardware (e.g., conversion hardware 400). In some embodiments, conversion of the digital signal to a fiber optic signal may be required to cross a dielectric gap on aerial device 100 (e.g., if boom 104 is insulated). In some embodiments, conversion of the digital signal to a fiber optic signal, rather than a wireless signal (i.e., bluetooth, wifi, etc.), may require lower energy levels to power the system (e.g., voltage and current alert system 200).

In a step 614, device movement is prevented. In an example of step 614, in some embodiments, a controller (e.g., controller 160) may prohibit movement of any individual aspect, or all aspects of aerial device 100. For example, controller 160 may prevent a user from operating, moving, or adjusting any portion of boom 104 following a detection event. In some embodiments, controller 160 may prevent actuation of one or more motors on aerial device 100 (e.g., first boom hydraulic cylinder 122, second boom hydraulic cylinder 124, etc.).

In a step 616, a user is alerted of the detection event. In an example of step 616, a controller (e.g., controller 160) may activate an alert subsystem (e.g., alert subsystem 180) to notify one or more users of the detection event. For example, in some embodiments, controller 160 may activate an audible, visual, and/or tactile alert on platform 112 to notify one or more operators of the detection event. In some embodiments, controller 160 may activate an audible, visual, and/or tactile alert at base 102 to notify one or more operators of the detection event. In some embodiments, the alert may indicate one or more of the distance, the current amount, and/or the voltage amount detected to the one or more users or operators. In some embodiments, the alert may indicate the component of aerial device 100 (e.g., elevator 130, lower boom 106, elbow 120, upper boom 108, platform 112, etc.) that has come within a threshold distance of the energized part 500.

In a step 618, acknowledgement of the detection event is monitored for. In an example of step 618, a controller (e.g., controller 160) may monitor for an acknowledgement (e.g., acknowledgement 171) from one or more users that they have been alerted. In some embodiments, controller 160 may require sufficient acknowledgment of the detection event before allowing operation of aerial device 100. In some embodiments, controller 160 may activate alert subsystem 180 for a predetermined amount of time before allowing sufficient acknowledgement via a user. For example, controller 160 may activate alert subsystem 180 for ten seconds before allowing acknowledgment of the detection event.

In a step 620, an acknowledgement is received. In an example of step 620, controller 160, via acknowledgement 171, may receive a signal that the detection event is acknowledged by a user or operator. In some embodiments, a user or operator may be instructed to visually locate the area in which aerial device 100 has come into close contact with the energized part 500 before acknowledging the detection event. In some embodiments, there may be a silence option that may shut off one or more of the audible, visual, and/or tactile alerts while the operator or user is identifying the area associated with the detection event. For example, in some instances, a user may be required to work within a certain proximity to an energized part 500. Accordingly, the user may desire to shut off the alert subsystem 180 while knowingly working near the energized part 500. In some embodiments, the controller 160 may require a user to sufficiently acknowledge the detection event before proceeding. For example, controller 160 may require an acknowledgement 171 to be pressed by an operator or user for a specified amount of time (e.g., three seconds) before proceeding. In some embodiments, aerial device 100 may include a telematic control unit (TCU), which may, in certain embodiments, provide the acknowledgement signal via telematics.

In an optional step 622, the voltage and/or current detection data is recorded. In an example of step 622, the controller (e.g., controller 160) may transiently record certain aspects of the detection event. For example, if controller 160 does not record information regarding the event, upon acknowledgement of the detection event, controller 160 may automatically alert the user again and shutdown operations of aerial device 100. Accordingly, the aspects of the detection event may be transiently stored on controller 160, such as on memory 163. These aspects may include, but are not limited to, voltage or current level, distance to energized part, direction to energized part, component of aerial device 100 closest to the energized part 500, etc.

In an optional step 624, the threshold levels for voltage, current, and/or distance are adjusted. For example, in some embodiments, the controller 160 may use information from step 622 to prevent an automatic re-alert for the same detection event by adjusting one or more of the threshold voltage or the threshold allowable distance sensed by the voltage or current sensors, therein forming an updated threshold voltage and an updated threshold allowable distance. In some embodiments, controller 160 may comprise steps in software 165 that determine how close components of aerial device 100 may get before alerting the user a second time. In some embodiments, controller 160 may be configured to continually adjust the thresholds for movement as voltage and current alert method 600 continues. For example, after a second alert, controller 160 may adjust the threshold for distance, voltage, etc. before a third alert. This may continue indefinitely throughout the operation of aerial device 100.

In a step 626, device movement is allowed. In an example of step 626, the controller (e.g., controller 160) may allow a user or operator to begin movement of some or all components of aerial device 100. For example, following sufficient acknowledgment of the detection event in step 620, controller 160 may allow a user to adjust boom 104. Method 600 may then proceed back to step 604. By proceeding back to step 604, method 600 may repeat continuously while the device is operated. For example, after beginning at step 602, method 600 may be continually operating until an event signifying the user is done operating aerial device 100. For example, this may include one or more of the following: positioning of the boom in a stowed position, pressing a button, turning of power to aerial device 100, signaling via interface 169 that the task is complete, movement of base 102, etc.

Voltage and current alert system 200 and method 600 greatly improve the safety of operators that operate a boom nearby energized parts. By utilizing a fiber optics signal for the system, the power requirements to operate the system significantly decrease. As such, a single battery is able to power the system for a much longer period of time. This prevents scenarios in which a user or operator forgets to change the battery of a safety system once it has run out, therein potentially endangering the safety of the one or more users of the device.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. An aerial device, comprising:
   a boom configured to be attached to a base at a first end;
   a platform attached to the boom at a second end;
   one or more voltage and current sensors disposed on one or more of the boom and the platform;
   a controller operatively connected to the boom and the one or more voltage and current sensors; and
   an alarm subsystem operatively connected to the controller,
   wherein the alarm subsystem is configured to receive a fiber optic signal from the controller upon detection, by the one or more voltage and current sensors, of a voltage or a current that is above a predetermined threshold and wherein a source of the voltage or the current is at or below a threshold allowable distance from the one or more voltage and current sensors,
   wherein upon receiving the fiber optic signal, the alarm subsystem alerts one or more users of the detection of the voltage or current.

2. The aerial device of claim 1, wherein the boom comprises a lower boom and an upper boom with an elbow disposed therebetween, the elbow having at least one voltage and current sensor disposed thereon.

3. The aerial device of claim 1, further comprising an acknowledgement indicator configured to relay an acknowledgement signal of a voltage detection or a current detection to the controller.

4. The aerial device of claim 1, further comprising an elevator disposed between the base and the first end of the boom, the elevator configured to raise the boom in a substantially vertical direction, and the elevator having at least one voltage and current sensor disposed thereon.

5. The aerial device of claim 1, wherein the controller is configured to prevent movement of the boom upon detection of the voltage or the current that is above the predetermined threshold by the one or more voltage and current sensors.

6. The aerial device of claim 1, further comprising fiber optic conversion hardware for converting a digital signal to the fiber optic signal.

7. The aerial device of claim 1, wherein the controller upon detection of the voltage or the current records detection event data, the detection event data comprising aspects of one or more of a measured voltage, a measured current, a measured distance, or a measured direction of the voltage or the current, and adjusts, based on the detection event data, one or more of a threshold voltage, a threshold current, or an updated threshold allowable distance.

8. A voltage and current alert system configured to detect proximity of an energized part near a boom of an aerial device, the system comprising:
   a controller operatively connected to the boom and one or more voltage and current sensors disposed on the aerial device, said one or more voltage and current sensors configured to send a digital signal upon a detection event to the controller,
   wherein the controller determines if a measured distance of the energized part from the aerial device is above a threshold allowable distance;
   a fiber optic low power (FOCL) conversion hardware operatively connected to the controller, said FOCL conversion hardware configured to convert the digital signal to a fiber optic signal; and
   an alert subsystem operatively connected to the FOCL conversion hardware, said alert subsystem configured to receive the fiber optic signal and alert one or more users of the aerial device of the detection event.

9. The voltage and current alert system of claim 8, wherein the boom is connected to a base of the aerial device at a first end and is connected to a platform at a second end, the platform configured to support one or more users of the aerial device,
   wherein the alert subsystem comprises an alert device disposed on the platform, said alert device is configured to alert the one or more users of the platform of the detection event.

10. The voltage and current alert system of claim 8, wherein the boom is connected to a base of the aerial device at a first end and is connected to a platform at a second end, the platform configured to support one or more users of the aerial device,
    wherein the alert subsystem comprises an alert device disposed on the base, said alert device is configured to alert one or more users nearby the base of the aerial device.

11. The voltage and current alert system of claim 8, wherein the fiber optic signal is configured to bypass a dielectric gap caused by insulating the boom.

12. The voltage and current alert system of claim 8, wherein the controller is configured to prevent movement of the boom upon the detection event.

13. The voltage and current alert system of claim 12, wherein the controller requires an acknowledgement by one or more users of the detection event before allowing movement of the boom.

14. The voltage and current alert system of claim 8, wherein the controller upon the detection event records detection event data, the detection event data comprising aspects of one or more of a measured voltage, a measured current, the measured distance, or a measured direction of the energized part, and adjusts, based on the detection event data, one or more of a threshold voltage, a threshold current, or an updated threshold allowable distance.

15. A voltage and current alert system, the system comprising:
    a processor; and
    one or more non-transitory computer readable storage media having a computer program stored thereon for alerting one or more users of an aerial device, wherein the computer program instructs the processor to perform actions comprising:
       receiving a startup signal from one or more components of the aerial device;
       monitoring for a voltage or a current from an energized part via one or more sensors disposed on the aerial device;
       detecting the voltage or the current from the energized part via the one or more sensors;
       determining whether a measured voltage or a measured current is above a threshold voltage or a threshold current, respectively;
       determining if a measured distance of the energized part from the aerial device is above a threshold allowable distance;
       converting a digital signal from the one or more sensors to a fiber optic low power (FOCL) signal via a FOCL conversion hardware, wherein the FOCL signal is configured to pass through a dielectric gap; and
       alerting the one or more users via an alert subsystem.

16. The voltage and current alert system of claim 15, the actions further comprising:
    preventing movement of the one or more components of the aerial device when the detected voltage or the detected current is above the threshold voltage or the threshold current, respectively.

17. The voltage and current alert system of claim 16, the actions further comprising:
    monitoring for acknowledgement of a detection event from the one or more users;
    receiving the acknowledgement of the detection event; and
    allowing movement of the one or more components of the aerial device following receiving the acknowledgement.

18. The voltage and current alert system of claim 15, the actions further comprising:
    recording detection event data, wherein the detection event data comprises aspects of one or more of a first measured voltage, a first measured current, a first measured distance, or a first measured direction of the energized part.

19. The voltage and current alert system of claim 18, the actions further comprising:
    adjusting, based on the detection event data, one or more of a threshold voltage, a threshold current, or a threshold distance to generate an updated threshold voltage, an updated threshold current, or an updated threshold allowable distance.

20. The voltage and current alert system of claim 19, the actions further comprising:
    alerting the one or more users via the alert subsystem if a controller, via the one or more sensors, determines that a second measured voltage is greater than the updated threshold voltage, that a second measured current is greater than the updated threshold current, or that a second measured distance is less than the updated threshold allowable distance, respectively.

* * * * *